United States Patent
Lu et al.

(10) Patent No.: US 10,199,281 B2
(45) Date of Patent: Feb. 5, 2019

(54) SUBSTRATE FEATURES FOR INDUCTIVE MONITORING OF CONDUCTIVE TRENCH DEPTH

(71) Applicant: Applied Materials, Inc., Santa Clara, CA (US)

(72) Inventors: Wei Lu, Westerna (AU); Zhihong Wang, Santa Clara, CA (US); Wen-Chiang Tu, Mountain View, CA (US); Zhefu Wang, Milpitas, CA (US); Hassan G. Iravani, Sunnyvale, CA (US); Boguslaw A. Swedek, Cupertino, CA (US); Fred C. Redeker, Fremont, CA (US); William H. McClintock, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/891,290

(22) Filed: Feb. 7, 2018

(65) Prior Publication Data

US 2018/0166347 A1    Jun. 14, 2018

Related U.S. Application Data

(63) Continuation of application No. 14/312,470, filed on Jun. 23, 2014, now Pat. No. 9,911,664.

(51) Int. Cl.
*H01L 21/66* (2006.01)
*H01L 21/321* (2006.01)

(52) U.S. Cl.
CPC .......... *H01L 22/14* (2013.01); *H01L 21/3212* (2013.01); *H01L 22/26* (2013.01); *H01L 22/30* (2013.01)

(58) Field of Classification Search
None
See application file for complete search history.

(56) References Cited

U.S. PATENT DOCUMENTS

| | | | |
|---|---|---|---|
| 4,000,458 A | 12/1976 | Miller et al. | |
| 7,112,960 B2 | 9/2006 | Miller et al. | |
| 7,132,297 B2 | 11/2006 | Griglione | |
| 7,709,956 B2 | 5/2010 | Naem | |
| 8,324,097 B2 | 12/2012 | Naem | |
| 8,334,582 B2 | 12/2012 | Jeng et al. | |

(Continued)

FOREIGN PATENT DOCUMENTS

| | | |
|---|---|---|
| JP | 2009-186367 | 8/2009 |
| JP | 2010-080551 | 4/2010 |

OTHER PUBLICATIONS

International Search Report and Written Opinion in International Application No. PCT/US2015/036484, dated Aug. 31, 2015, 9 pages.

(Continued)

*Primary Examiner* — Telly Green
(74) *Attorney, Agent, or Firm* — Fish & Richardson P.C.

(57) ABSTRACT

A substrate for use in fabrication of an integrated circuit has a layer with a plurality of conductive interconnects. The substrate includes a semiconductor body, a dielectric layer disposed over the semiconductor body, a plurality of conductive lines of a conductive material disposed in first trenches in the dielectric layer to provide the conductive interconnects, and a closed conductive loop structure of the conductive material disposed in second trenches in the dielectric layer. The closed conductive loop is not electrically connected to any of the conductive lines.

12 Claims, 8 Drawing Sheets

(56) References Cited

U.S. PATENT DOCUMENTS

| | | |
|---|---|---|
| 8,628,376 B2 | 7/2014 | Sin et al. |
| 2003/0201768 A1 | 10/2003 | Le |
| 2003/0223150 A1 | 12/2003 | Lee |
| 2005/0072528 A1 | 4/2005 | Owzcarz et al. |
| 2005/0170554 A1 | 8/2005 | Griglione |
| 2006/0055007 A1 | 3/2006 | Yao et al. |
| 2009/0174011 A1 | 7/2009 | Jeon et al. |
| 2009/0256558 A1 | 10/2009 | Fujita et al. |
| 2010/0065964 A1 | 3/2010 | Naem |
| 2011/0189925 A1 | 8/2011 | Iravani et al. |
| 2012/0276661 A1 | 11/2012 | Irayani |
| 2012/0276662 A1 | 11/2012 | Iravani et al. |
| 2012/0276817 A1 | 11/2012 | Irayani |

OTHER PUBLICATIONS

Chen and Ker, "Investigation on seal-ring rules for IC product reliability in 0.25-μm CMOS technology," 2002, 45: 1311-1316.

SUBSTRATE FEATURES FOR INDUCTIVE MONITORING OF CONDUCTIVE TRENCH DEPTH

CROSS-REFERENCE TO RELATED APPLICATIONS

This application is a continuation of U.S. patent application Ser. No. 14/312,470, filed Jun. 23, 2014, which is incorporated by reference.

TECHNICAL FIELD

The present disclosure relates to inductive monitoring during chemical mechanical polishing of substrates.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a conductive filler layer on a patterned insulative layer to fill the trenches or holes in the insulative layer. The filler layer is then polished until the raised pattern of the insulative layer is exposed. After planarization, the portions of the conductive filler layer remaining between the raised pattern of the insulative layer form vias, plugs and lines that provide conductive paths between thin film circuits on the substrate.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad.

One problem in CMP is determining whether the polishing process is complete, i.e., whether a substrate layer has been planarized to a desired flatness or thickness, or when a desired amount of material has been removed. Variations in the slurry composition, the polishing pad condition, the relative speed between the polishing pad and the substrate, the initial thickness of the substrate layer, and the load on the substrate can cause variations in the material removal rate. These variations cause variations in the time needed to reach the polishing endpoint. Therefore, determining the polishing endpoint merely as a function of polishing time can lead to non-uniformity within a wafer or from wafer to wafer.

In some systems, a substrate is monitored in-situ during polishing, e.g., through the polishing pad. One monitoring technique is to induce an eddy current in the conductive layer and detect the change in the eddy current as the conductive layer is removed.

SUMMARY

In some integrated circuit fabrication processes, polishing continues after the patterned insulative layer has been exposed, e.g., in order to reduce the depth of the conductive lines in the trenches. It would be desirable to reliably halt polishing of the substrate when the trenches have a target depth. However, due to the small line width of the trenches, it can be difficult to induce eddy currents in the conductive lines. Consequently, conventional eddy current monitoring techniques may not be sufficient to reliably determine the depth of the trenches, and thus may not reliably halt polishing when the trenches have the target depth.

However, an alternative approach is to incorporate a conductive loop into the substrate being polished. Passage of a magnetic field through the conductive loop can induce a current in the loop. With respect to the voltage source that generates the magnetic field, the conductive loop generally acts as an impedance that depends on the depth of the conductive material. This permits generation of a signal that depends on the depth of the conductive material in the trench.

In one aspect, a method of chemical mechanical polishing a substrate includes, in fabrication of an integrated circuit having a layer with a plurality of conductive interconnects, polishing a layer of a substrate to provide the layer of the integrated circuit, wherein the layer of the substrate includes conductive lines to provide the conductive interconnects. The layer of the substrate includes a closed conductive loop formed of a conductive material in a trench. A depth of the conductive material in the trench is monitored using an inductive monitoring system and a signal is generated. Monitoring includes generating a magnetic field that intermittently passes through the closed conductive loop. A sequence of values over time is extracted from the signal, the sequence of values representing the depth of the conductive material over time. A polishing endpoint is detected by determining from the sequence of values that a depth of the conductive material has reached a target depth, or at least one pressure applied by a carrier head to the substrate during polishing of the layer is adjusted based on the sequence of values such that different zones on the substrate have closer to the same endpoint time than without such an adjustment.

In another aspect, a method of chemical mechanical polishing a substrate includes, in fabrication of an integrated circuit having a layer with a plurality of conductive interconnects, polishing a layer of a substrate to provide the layer of the integrated circuit. The layer of the substrate includes conductive lines to provide the conductive interconnects, and the layer of the substrate includes a closed conductive loop formed of a conductive material in a trench. A depth of the conductive material in the trench is monitored using an inductive monitoring system and a signal is generated. Monitoring includes generating a magnetic field from a core having a prong oriented substantially perpendicular to the layer of the substrate. The magnetic field intermittently passes through the closed conductive loop. A lateral dimension of the closed conductive loop is about 1-2 times a lateral dimension of the prong.

In another aspect, a computer program product or a polishing system is provided that carries out these methods.

In another aspect, a substrate for use in fabrication of an integrated circuit has a layer with a plurality of conductive interconnects. The substrate includes a semiconductor body, a dielectric layer disposed over the semiconductor body, a plurality of conductive lines of a conductive material disposed in first trenches in the dielectric layer to provide the conductive interconnects, and a closed conductive loop structure of the conductive material disposed in second trenches in the dielectric layer. The closed conductive loop structure includes a plurality of openings through a conductive region to provide a plurality of electrically connected conductive loops. The closed conductive loop is not electrically connected to any of the conductive lines.

In another aspect, a substrate for use in fabrication of an integrated circuit has a layer with a plurality of conductive interconnects. The substrate includes a semiconductor body, a first dielectric layer disposed over the semiconductor body, a first plurality of conductive lines of a conductive material disposed in first trenches in the first dielectric layer to provide at least some of the conductive interconnects, a first closed conductive loop structure of the conductive material disposed in second trenches in the first dielectric layer, a second dielectric layer disposed over the first dielectric layer, a second plurality of conductive lines of the conductive material disposed in third trenches in the second dielectric layer to provide at least some of the conductive interconnects, and a second closed conductive loop structure of the conductive material disposed in fourth trenches in the second dielectric layer, wherein a width of the second closed conductive loop structure is greater than a width of the first closed conductive loop structure.

Certain implementations can include one or more of the following advantages. The depth (or conductivity) of a conductive material, e.g., a metal such as copper, in a trench, can be sensed. Polishing can be halted more reliably when the trenches have a target depth, and closed loop control of carrier head pressure can be performed to drive to uniform metal line thickness and conductivity. Thus, the overall fabrication process can have improved yield.

The details of one or more implementations are set forth in the accompanying drawings and the description below. Other aspects, features and advantages will be apparent from the description and drawings, and from the claims.

BRIEF DESCRIPTION OF DRAWINGS

Like reference symbols in the various drawings indicate like elements.

DETAILED DESCRIPTION

CMP systems can use an inductive monitoring system to detect the depth of a conductive material in a trench on a substrate. The measurements can be used to halt polishing when the trenches have a target depth, or to adjust processing parameters of the polishing process in real time. For example, a substrate carrier head can adjust the pressure on the backside of the substrate can be adjusted so that the trenches in different regions of the substrate have substantially the same depth after polishing.

Figure 1:
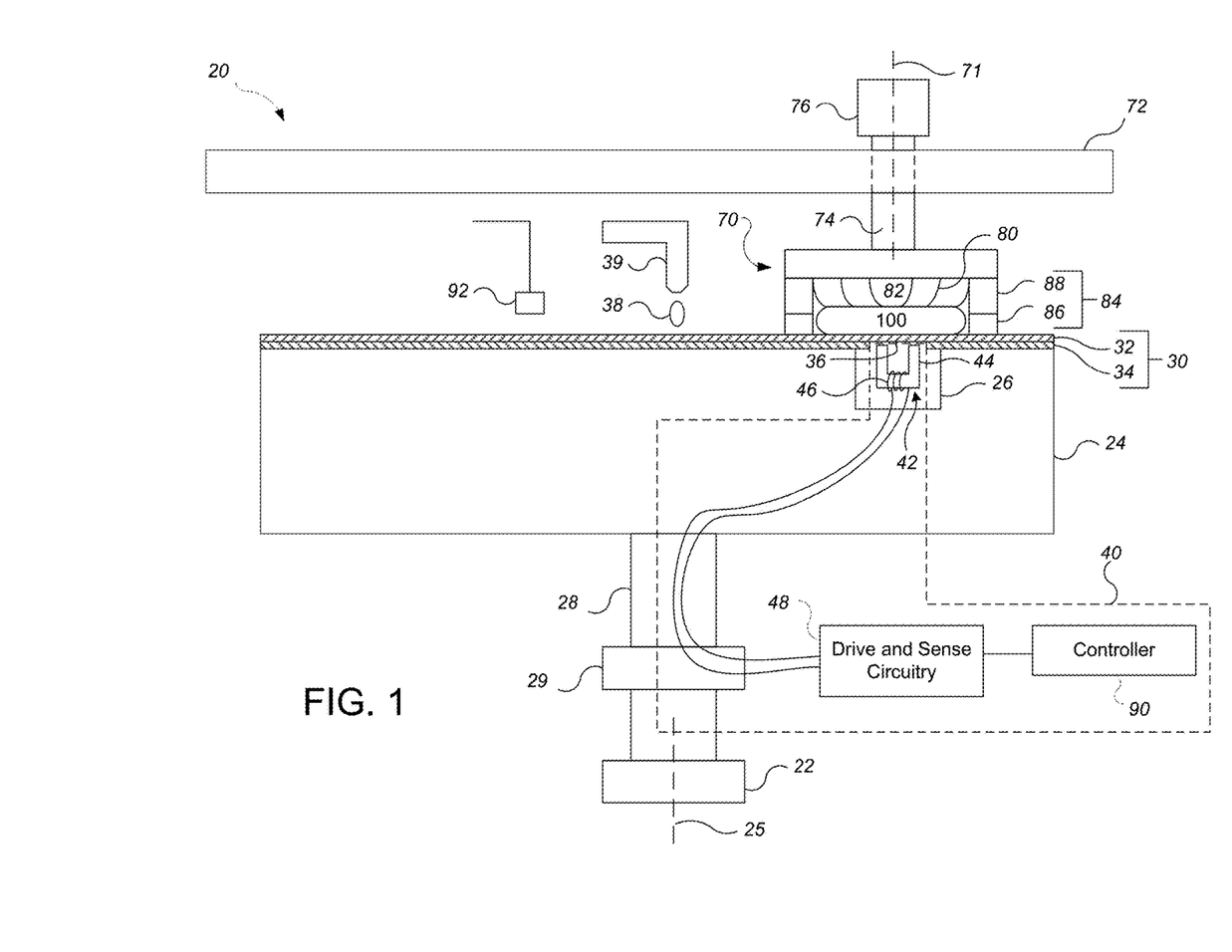
FIG. 1 is a schematic side view, partially cross-sectional, of a chemical mechanical polishing station that includes an inductive monitoring system.

FIG. 1 illustrates an example of a polishing station 20 of a chemical mechanical polishing apparatus. The polishing station 20 includes a rotatable disk-shaped platen 24 on which a polishing pad 30 is situated. The platen 24 is operable to rotate about an axis 25. For example, a motor 22 can turn a drive shaft 28 to rotate the platen 24. The polishing pad 30 can be a two-layer polishing pad with an outer layer 34 and a softer backing layer 32.

The polishing station 22 can include a supply port or a combined supply-rinse arm 39 to dispense a polishing liquid 38, such as slurry, onto the polishing pad 30. The polishing station 22 can include a pad conditioner apparatus with a conditioning disk to maintain the condition of the polishing pad.

The carrier head 70 is operable to hold a substrate 100 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel or track 72; or by rotational oscillation of the carousel itself. In operation, the platen is rotated about its central axis 25, and the carrier head is rotated about its central axis 71 and translated laterally across the top surface of the polishing pad 30. Where there are multiple carrier heads, each carrier head 70 can have independent control of its polishing parameters, for example each carrier head can independently control the pressure applied to each respective substrate.

The carrier head 70 can include a flexible membrane 80 having a substrate mounting surface to contact the back side of the substrate 100, and a plurality of pressurizable chambers 82 to apply different pressures to different zones, e.g., different radial zones, on the substrate 100. The carrier head can also include a retaining ring 84 to hold the substrate. In some implementations, the retaining ring 84 may include a highly conductive portion, e.g., the carrier ring can include a thin lower plastic portion 86 that contacts the polishing pad, and a thick upper conductive portion 88. In some implementations, the highly conductive portion is a metal, e.g., the same metal as the layer being polished, e.g., copper or cobalt.

A recess 26 is formed in the platen 24, and optionally a thin section 36 can be formed in the polishing pad 30 overlying the recess 26. The recess 26 and thin pad section 36 can be positioned such that regardless of the translational position of the carrier head they pass beneath substrate 10 during a portion of the platen rotation. Assuming that the polishing pad 30 is a two-layer pad, the thin pad section 36 can be constructed by removing a portion of the backing layer 32. The thin section can optionally be optically transmissive, e.g., if an in-situ optical monitoring system is integrated into the platen 24.

An in-situ monitoring system 40 generates a time-varying sequence of values that depend on the thickness of a conductive trench on the substrate 10. In particular, the in-situ monitoring system 40 can be an inductive monitoring system. In operation, the polishing station 22 uses the monitoring system 40 to determine when the trenches have been polished to a target depth.

The inductive monitoring system 40 can include an inductive sensor 42 installed in the recess 26 in the platen. The sensor 26 can include a magnetic core 44 positioned at least partially in the recess 26, and at least one coil 46 wound around the core 44. Drive and sense circuitry 48 is electrically connected to the coil 46. The drive and sense circuitry 48 generates a signal that can be sent to a controller 90. Although illustrated as outside the platen 24, some or all of the drive and sense circuitry 48 can be installed in the platen 24. A rotary coupler 29 can be used to electrically connect components in the rotatable platen, e.g., the coil 46, to components outside the platen, e.g., the drive and sense circuitry 48.

The core 44 can include two (see FIG. 1) or three (see FIG. 2) prongs 50 extending in parallel from a back portion 52. Implementations with only one prong (and no back portion) are also possible.

Figure 2:
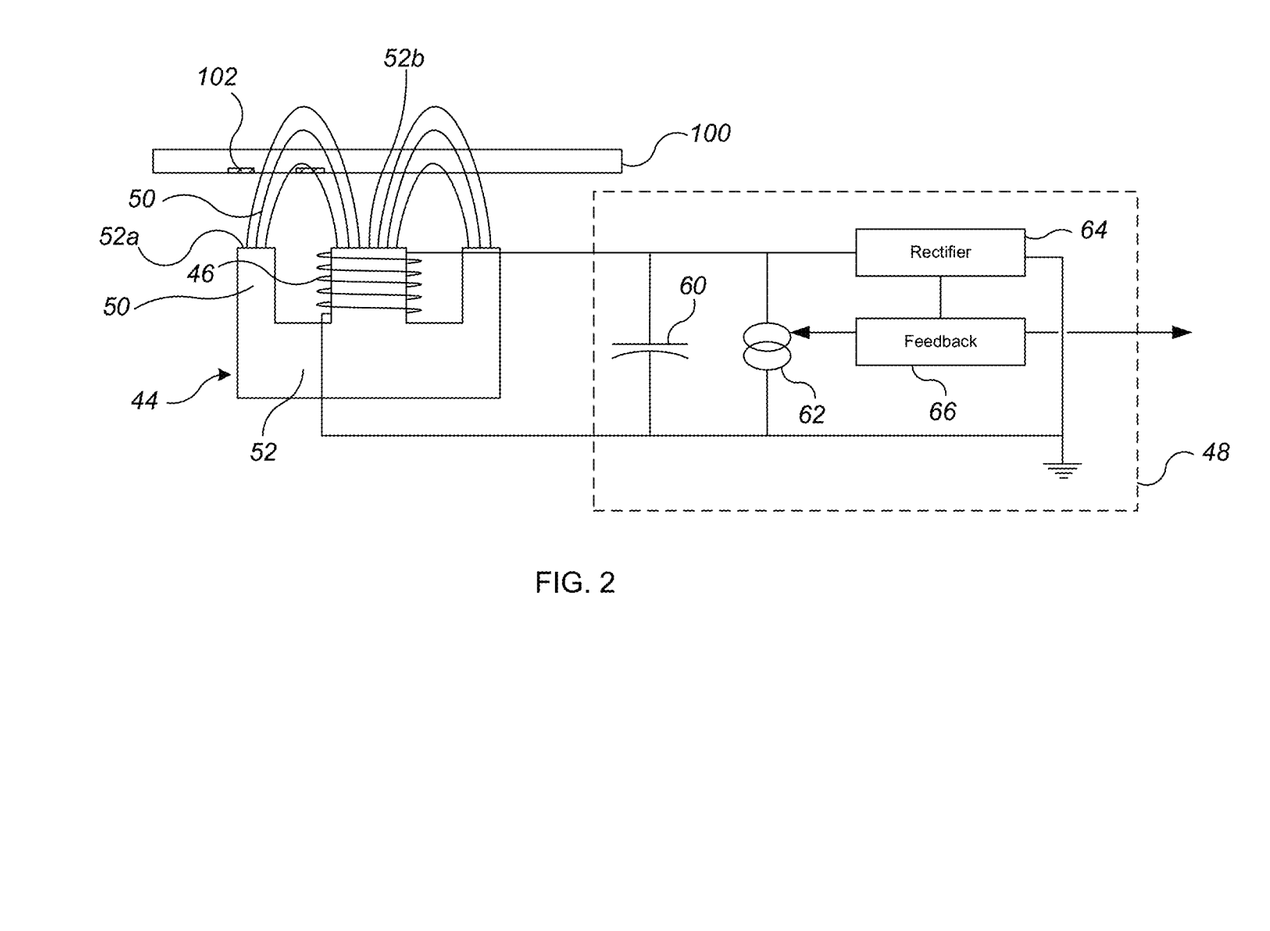
FIG. 2 is a schematic circuit diagram of portions of the inductive monitoring system.

Referring to FIG. 2, the circuitry 48 applies an AC current to the coil 46, which generates a magnetic field 50 between two poles 52a and 52b of the core 44. In operation, a portion of the magnetic field 50 extends into the substrate 100.

FIG. 2 illustrates an example of the drive and sense circuitry 48. The circuitry 48 includes a capacitor 60 connected in parallel with the coil 46. Together the coil 46 and the capacitor 60 can form an LC resonant tank. In operation, a current generator 62 (e.g., a current generator based on a marginal oscillator circuit) drives the system at the resonant frequency of the LC tank circuit formed by the coil 46 (with inductance L) and the capacitor 60 (with capacitance C). The current generator 62 can be designed to maintain the peak to peak amplitude of the sinusoidal oscillation at a constant value. A time-dependent voltage with amplitude $V_0$ is rectified using a rectifier 64 and provided to a feedback circuit 66. The feedback circuit 66 determines a drive current for current generator 62 to keep the amplitude of the voltage $V_0$ constant. Marginal oscillator circuits and feedback circuits are further described in U.S. Pat. Nos. 4,000,458, and 7,112,960 which are incorporated by reference.

When the magnetic field 50 passes through a conductive loop on the substrate, the magnetic field 50 generates a current in the loop. This increases the effective impedance, thus increasing the drive current required for the current generator 62 to keep the amplitude of the voltage $V_0$ constant. The extent of the increase of the effective impedance depends on the conductivity of the loop, which depends on the depth of the conductive material in the trench defining the loop. In short, power dissipation by the conductive loop linearly relates to the depth of conductive material in the trench. Thus, the drive current generated by the current generator 62 provides a measurement of the depth of the conductive material in the trench.

Other configurations are possible for the drive and sense circuitry 48. For example, separate drive and sense coils could be wound around the core, the drive coil could be driven at a constant frequency, and the amplitude or phase (relative to the driving oscillator) of the current from the sense coil could be used for the signal. Returning to FIG. 1, in some implementations, the polishing station 20 includes a temperature sensor 92 to monitor a temperature in the polishing station or a component of/in the polishing station. Although illustrated in FIG. 1 as positioned to monitor the temperature of the polishing pad 30 and/or slurry 38 on the pad 30, the temperature sensor 92 could be positioned inside the carrier head to measure the temperature of the substrate 100. The temperature sensor can be in direct contact (i.e., a contacting sensor) with the polishing pad or the exposed surface of the substrate 10, or the temperature sensor can be a non-contacting sensor (e.g., an infrared sensor). The monitored temperature(s) can be used in adjusting the measurements from the inductive monitoring system.

In some implementations, a polishing apparatus includes additional polishing stations. For example, a polishing apparatus can include two or three polishing stations. For example, the polishing apparatus can include a first polishing station with an eddy current monitoring system and a second polishing station with an inductive monitoring system.

For example, in operation, bulk polishing of the conductive layer on the substrate can be performed at the first polishing station, and polishing can be halted when the barrier layer or patterned dielectric layer is exposed. The substrate is then transferred to the second polishing station, and the substrate can be polished until the trenches reach the target depth.

Figure 3:
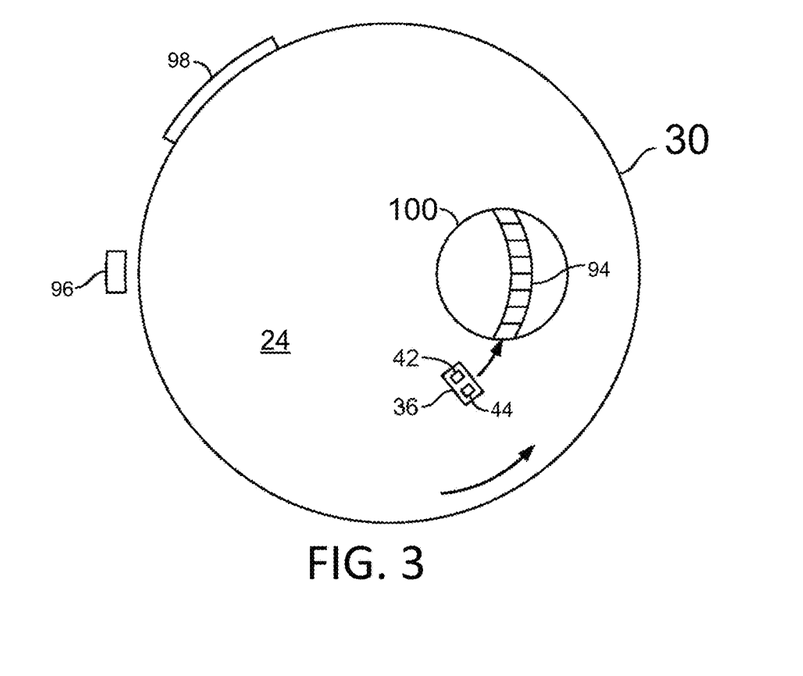
FIG. 3 is a schematic top view of a platen of a chemical mechanical polishing station.

FIG. 3 illustrates a top view of the platen 24. As the platen 24 rotates, the sensor 42 sweeps below the substrate 100. By sampling the signal from the circuitry 48 at a particular frequency, the circuitry 48 generates measurements at a sequence of sampling zones 94 across the substrate 100. For each sweep, measurements at one or more of the sampling zones 94 can be selected or combined. Thus, over multiple sweeps, the selected or combined measurements provide the time-varying sequence of values. In addition, off-wafer measurements may be performed at the locations where the sensor 49 is not positioned under the substrate 10.

The polishing station 20 can also include a position sensor 96, such as an optical interrupter, to sense when the inductive sensor 42 is underneath the substrate 100 and when the eddy current sensor 42 is off the substrate. For example, the position sensor 96 can be mounted at a fixed location opposite the carrier head 70. A flag 98 can be attached to the periphery of the platen 24. The point of attachment and length of the flag 98 is selected so that it can signal the position sensor 96 when the sensor 42 sweeps underneath the substrate 10.

Alternately, the polishing station 20 can include an encoder to determine the angular position of the platen 24. The inductive sensor can sweep underneath the substrate with each rotation of the platen.

A controller 90, e.g., a general purpose programmable digital computer, receives the sequence of values from the inductive monitoring system. Since the sensor 42 sweeps beneath the substrate with each rotation of the platen, information on the depth of the trenches is accumulated in-situ and on a continuous real-time basis (once per platen rotation). The controller 90 can be programmed to sample measurements from the monitoring system when the substrate generally overlies the thin section 36 (as determined by the position sensor). As polishing progresses, the thickness of the conductive layer changes, and the sampled signals vary with time. The measurements from the monitoring system can be displayed on an output device during polishing to permit the operator of the device to visually monitor the progress of the polishing operation.

In addition, the controller 90 can be programmed to divide the measurements from both the inductive current monitoring system 40 from each sweep beneath the substrate into a plurality of sampling zones, to calculate the radial position of each sampling zone, and to sort the measurements into radial ranges.

The controller 90 may also be connected to the pressure mechanisms that control the pressure applied by carrier head 70, to carrier head rotation motor 76 to control the carrier head rotation rate, to the platen rotation motor 21 to control the platen rotation rate, or to slurry distribution system 39 to control the slurry composition supplied to the polishing pad. Specifically, after sorting the measurements into radial ranges, information on the trench depth can be fed in real-time into a closed-loop controller to periodically or continuously modify the polishing pressure profile applied by a carrier head, as discussed further below.

Figure 4A:
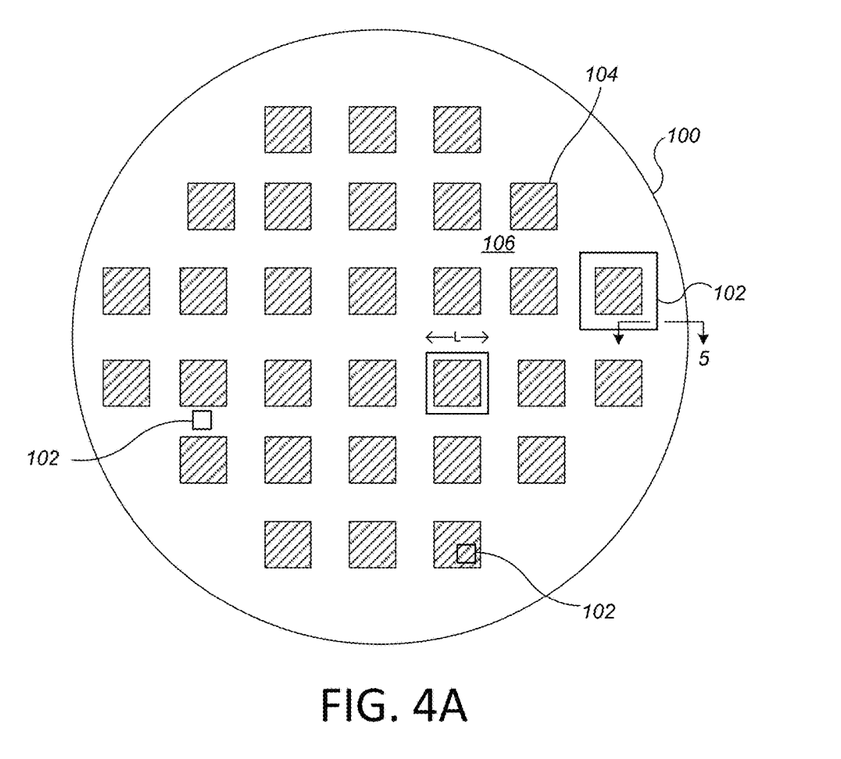
FIG. 4A is a schematic top view of a substrate.
Figure 4B:
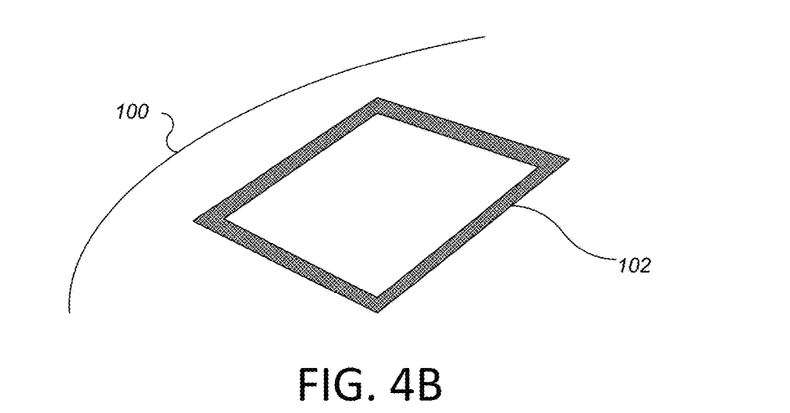
FIG. 4B is a schematic perspective view of a conductive loop on a substrate.

FIGS. 4A and 4B illustrate a substrate 100 that has a closed conductive loop 102. In general, the substrate will have multiple closed conductive loops 102, and the closed conductive loops can be distributed uniformly across the substrate. Each conductive loop 102 need not be connected to other interconnect wiring in the substrate; it can be a free-standing feature on the substrate. The conductive loop can have a line width W (see FIG. 5) of about 0.5 to 10 um, depending on the metal layer being used. The conductive loop 102 has the same depth as the other interconnect wiring in the layer.

In some implementations, the closed conductive loop 102 encircles a die 104. For example, the closed conductive loop can be located in the scribe line region 106 between dies 104. In some implementations, the closed conductive loop 102 is located in the scribe line region 106, but does not encircle a die 104. Alternatively, a closed conductive loop 102 can be located within a die. In this case, electrical connections to any circuitry 110 to be used by the integrated circuit but located within the loop 102 would need to be routed through conductive lines that pass over or under the loop 102 in another conductive layer.

As shown in FIG. 4A, a single wafer 100 typically is fabricated with multiple dies 104. In some implementations, each die 104 has an associated conductive loop 102. For example, each die 104 can surrounded by its own conductive loop, or a conductive loop can be located within each die 104, or a conductive loop can be positioned adjacent each die 104 in the scribe line region. Each die can have multiple conductive loops, and the conductive loops can have the same size or be different sizes. Eventually the wafer is diced to separate the individual dies.

Although FIGS. 4A and 4B illustrate the loop as generally rectangular, this is not required; the loop could be an arbitrary simple (i.e., non-self-intersecting) shape, such as an n-sided simple polygon. The loop can also have one or more curved segments.

The signal strength from the inductive monitoring system 40 will depend on the size of the conductive loop 102 relative to the sensor 42, and in particular relative to the horizontal dimensions of the prongs 50 and the distance of the loop 102 from the core 44. The power dissipation through a conductive loop is determined by both the magnetic flux through the loop and the electrical resistance of the loop. On the one hand, the smaller the conductive loop, the less magnetic flux will pass through the loop, and the weaker the signal will be. On the other hand, if the conductive loop is too large, then the magnetic field lines emerging from one of the poles will curve back to the other pole while staying within the area of the loop, such that the total magnetic flux through the loop again is reduced. In addition, the electrical resistance of the loop increases linearly with the total length of the loop. This results in a decrease in power dissipation, thus weaker signal, for a sensor with a certain size. In general, the size of the loop should generally match the size of one of the prongs 50 of the core 46. For example, the lateral dimension L of the conductive loop 102 should be approximately 1-2 times the lateral dimension of one of the prongs 50 of the core 46.

Figure 5:
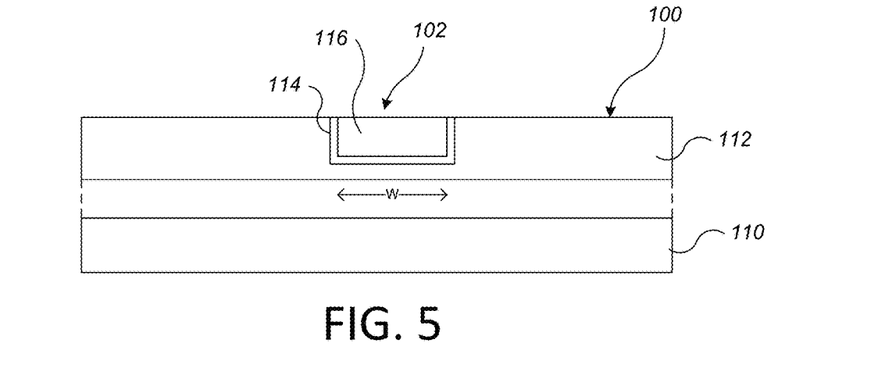
FIG. 5 is a schematic cross-sectional view of a substrate, e.g., along line 5 from FIG. 4A.

Referring to FIG. 5, the closed conductive loop 102 is fabricated simultaneously with the other conductive features in the conductive layer being fabricated. In particular, a trench is formed, e.g., by etching, in a dielectric layer 112 that has been deposited on a wafer 110. The dielectric layer 112 can be a stack of layers, e.g., a low-k layer, a capping layer, etc. A thin barrier layer 114, can be deposited to coat the inside of the trench and the top surface of the dielectric layer 112. Then a conductive material 116 can be deposited to fill the trench; the conductive material also covers the top surface of the dielectric layer 112. The conductive material can be a metal, e.g., copper or cobalt. The barrier layer can be titanium, titanium nitride, or tantalum nitride.

The conductive material 116 is then polished away to expose the top surface of the dielectric layer 114. It is at this point that the substrate reaches the state shown in FIG. 4A. Polishing of the substrate 100 can continue until the conductive material 116 in the trench reaches a target depth. During this portion of the polishing step, the depth of the trench can be monitored using the inductive monitoring system. Polishing to reduce the trench depth can be performed at the same platen that is used for exposing the top surface of the dielectric layer 114.

Since the conductive loop 102 is fabricated in the same process as the other conductive components in the layer, the trench of the conductive loop 102 should have the same depth as the trenches in the die that will provide the circuitry of the integrated circuit. Thus, monitoring of the thickness of the conductive loop 102 can reasonably be relied upon for monitoring of the thickness of the other conductive features.

Figure 6:
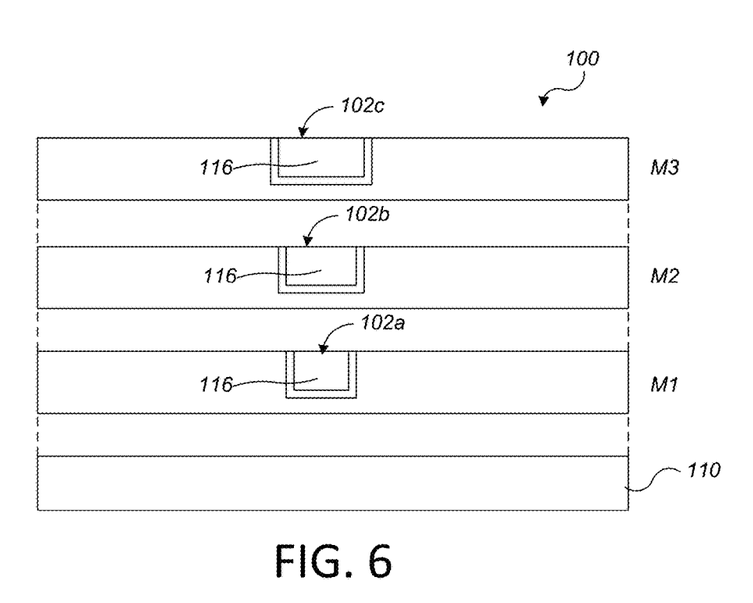
FIG. 6 is a schematic cross-sectional view of a substrate having multiple layers.

In many substrates, there are multiple layers with metal features formed on a substrate. These layers sometimes referred to as M1, M2, etc., with M1 being the metal layer closest to the semiconductor wafer. Referring to FIG. 6, when a substrate with multiple layers is being polished, a conductive loop can be formed in each layer. For example, conductive loops 102a, 102b, 102c can be formed in metal layers M1, M2, M3, respectively. In some implementations, conductive loops in two different layers are substantially aligned, e.g., the conductive loop 102b is directly above the conductive loop 102a.

A potential problem is that the conductive loops in lower layers contribute to the measured signal, and consequently serve as a source of noise during monitoring of the trench depth in the outermost layer. In some implementations, the farther the layer is from the substrate, the wider the conductive loop is. For example, the conductive loop 102c in M3 can be wider than the conductive loop 102b in M2, which can be wider than the conductive loop 102a in M1. In contrast, the lines that provide the conductive interconnects of the integrated circuit can have the same width in each layer.

Due to the increased width of the loop, the loop has a lower resistance. As a result, the signal strength from the loop in each layer becomes consecutively stronger. For example, the signal strength from the conductive loop 102c can larger than the signal strength from the conductive loop 102b, which can be stronger than the signal strength from the conductive loop 102a. Since the signal strength increases with each layer, noise resulting from the conductive loops in the lower layers has less impact on become less the signal to noise ratio a source of noise during reliability of monitoring of the trench depth in the outermost layer.

Optionally, each conductive loop can be electrically connected to the conductive loop in the next lower layer. For example, conductive loop 102c can be electrically connected to conductive loop 102b, and conductive loop 102b can be electrically connected to conductive loop 102a.

Figure 7:
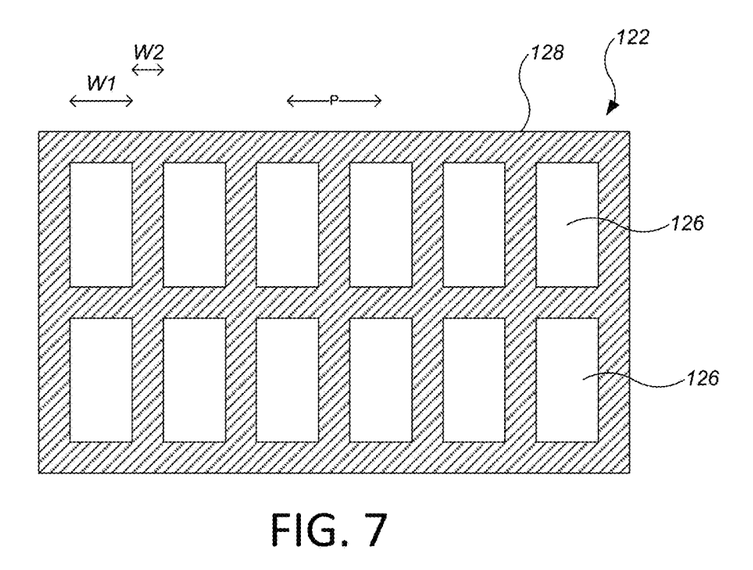
FIG. 7 is a schematic top view of a multiple conductive loop structure.

Referring to FIG. 7, in some implementations, the single conductive loop 102 is replaced by a multi-loop structure 122. The structure 122 has multiple openings 126 separated by conductive lines 128. The openings 126 can be uniformly spaced apart. In some implementations, the structure 122 is formed by inserting dielectric slits in a metal ring line. The composite structure of the multi-loop structure 122 can be designed to have close or similar CMP behaviors as those of critical device trenches or interconnect lines that will form part of the integrated circuit in the die 102.

The ratio of the area covered by the openings 126 relative to the area covered by the lines 102 can be selected to match the pattern density of the device pattern in the adjacent die. For example, if the device pattern in the adjacent die has a 50% pattern density, the ratio of the area covered by the lines to the total area can be 0.5. This permits the metal lines to have a similar response to the CMP operation as the pattern in the die.

Returning to FIGS. 1-3, as noted above, when the magnetic field 50 passes through a conductive loop on the substrate, the magnetic field 50 generates a current in the loop, which results in a change in signal strength from the inductive monitoring system. However, since the sensor 42 is moving relative to the substrate, and the loops are distributed across the substrate, the sensor 42 at some times will be located over a region without a loop, and might only intermittently sweep across a loop 10. As a result, the signal from the inductive monitoring system will only intermittently register the effects from the loops.

Figure 8:
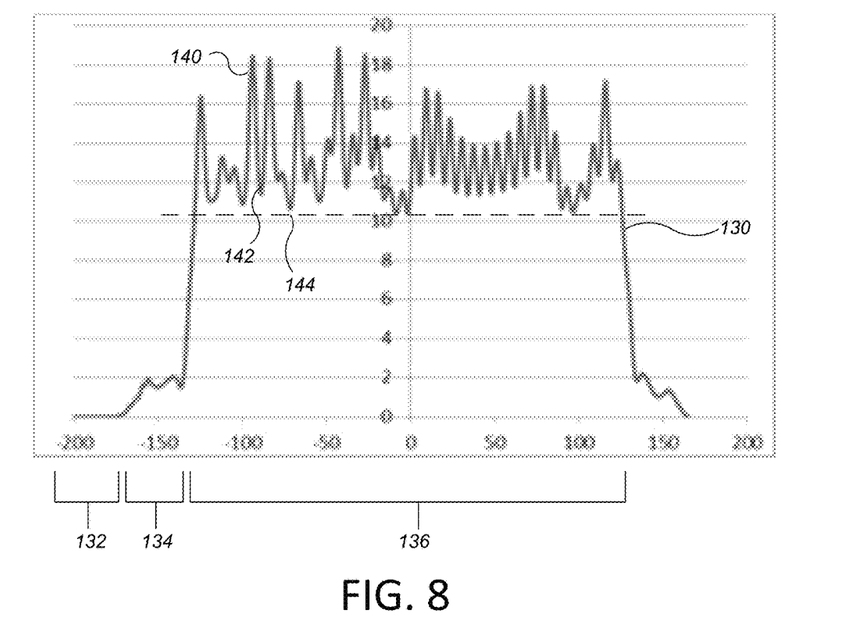
FIG. 8 illustrates a signal from an inductive monitoring system.

FIG. 8 illustrates a graph of a sample signal 130 from a single sweep of the sensor 42 across a substrate 100. In the graph, the horizontal axis represents distance from the center of the substrate, and the vertical axis represents the signal strength (in arbitrary units). The signal 130 includes an initial portion 132 of low signal strength. The portion 132 can represent a time where the sensor is not below the carrier head, so there is nothing to generate a signal. This is followed by a portion 134 of moderate signal strength. This portion 134 can represent a time where the sensor is below the retaining ring, so metal parts in the carrier or retaining ring might generate some signal.

There then follows a portion 136 that appears to have significant "noise", with many individual spikes 140 separated by valleys 142. In general, over the portion 136, the signal strength does not fall below a minimum 144. Without being limited to any particular theory, the spikes 140 can represent times when the sensor 42 is located below a loop, and the valleys 142 can represent times when the sensor is located below a region that does not have a loop.

Since the signal strength of the spikes 140 represents the depth of the trenches, the signal needs to be processed to remove extraneous background signal and noise. The signal processing can be performed by the controller 90.

In general, a signal window is selected. The signal window can represent a portion of time that the sensor is scanning across the substrate, or a radial zone on the substrate. Optionally, the signal can initially be subject to a high-pass filter to remove DC portion of the signal which is not generated by the conductive loops on the substrate. The signal strength when the sensor is not below the carrier head is measured to generate a reference value. This reference value is subtracted from the signal measured while the sensor is below the carrier head, e.g., during the signal window. This can compensate for signal drift within a polishing operation for a substrate, e.g., due to chemical or thermal environmental changes.

In one implementation, the strength of the signal 130 is averaged over the entire signal window to generate an average signal value. The average value can be used as the output value. This technique can be appropriate where the conductive loops are uniformly and densely distributed across the substrate.

In another implementation, individual peaks 140 within the signal window are identified. The maximum signal strength of each peak 140 is determined. The signal strength of the floor, e.g., the average value of the valley region between peaks, is subtracted from the signal strength of each peak to generate a set of peak-to-floor signal values. The set of peak-to-floor signal values from the signal window can be averaged to generate an average peak-to-floor signal value. The average peak-to-floor signal value can be used as the output value. This technique can be appropriate for signals with sparse peaks and a flat floor, e.g., where the conductive loops are distributed with a relatively low density and are located within each die.

In another implementation, individual peaks 140 within the signal window are identified. The maximum signal strength of each peak 140 is determined. The signal strength of the peaks within the signal window can be averaged to generate an average peak value. The average peak signal value can be used as the output value. This technique can be appropriate for signals with sparse and uneven peaks, e.g., where there are conductive loops of different sizes within each die and distributed with relatively low density.

In each of the above implementations, since there is one output value for the signal window per sweep, as polishing progresses this generates a sequence of values which can be used for endpoint detection or closed loop polishing rate control.

It should be understood that the "peaks" can be upward spikes from a lower baseline signal, or downward spikes from a higher baseline signal.

Figure 9:
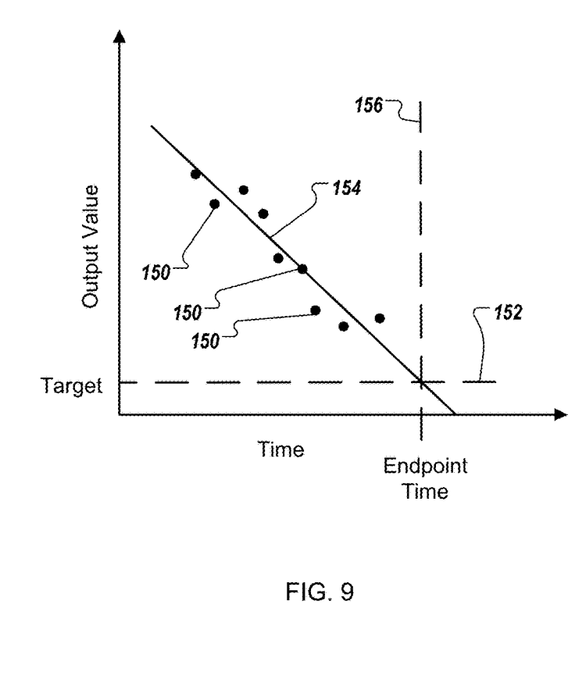
FIG. 9 illustrates a sequence of values generated by the inductive monitoring system.

FIG. 9 is an example graph of output values 150 generated by the inductive monitoring system during polishing of a device substrate 100. In the graph, the horizontal axis represents time and the vertical axis represents the output value. In some implementations, the output value can be converted, e.g., using a look-up table, a thickness value, which provide the values 150.

In some implementations, endpoint can be called when the current value of the second spectral feature reaches a target value 152. The target value 152 represents the output of the inductive monitoring system when the trench has a target depth.

In some implementations, a function 154 is fit to the output values 152, e.g., using a robust line fit. The function 154 can be used to determine the polishing endpoint time. In some implementations, the function is a linear function of time. In some implementations, the time at which the function 154 equals the target value 152, provides the endpoint time 156.

Figure 10:
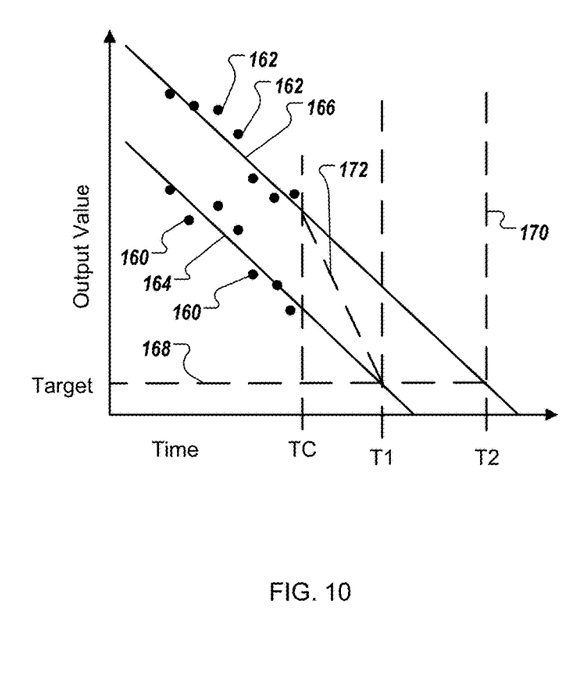
FIG. 10 illustrates two sequence of values generated by the inductive monitoring system for two zones on a substrate.

FIG. 10 is an example graph of output values for two different zones on the substrate 100. For example, the inductive monitoring system 40 can track a first zone located toward an edge portion of the substrate 100 and a second zone located toward a center of the substrate 100. A sequence of first output values 160 can be measured from the first zone of the substrate 100, and a sequence of second output values 162 can similarly be measured from the second zone of the substrate 100.

A first function 162, e.g., a first line, can be fit to the sequence of first output values 164, and a second function 166, e.g., a second line, can be fit to the sequence of second values 162. The first function 164 and the second function 166 can be used to determine to an adjustment to the polishing rate of the substrate 10.

During polishing, an estimated endpoint calculation based on a target value 168 is made at time TC with the first function for the first zone of the substrate 100 and with the second function for the second zone of the substrate 100. The target value 168 represents the output of the inductive monitoring system when the trench has a target depth. If the estimated endpoint times T1 and T2 for the first and the second zones differ (or if the values of the first function and second function at an estimated endpoint time 170 differ), the polishing rate of at least one of the zones can be adjusted so that the first zone and second zone have closer to the same endpoint time than without such an adjustment. For example, if the first zone will reach the target value 168 before the second zone, the polishing rate of the second zone can be increased (shown by line 172) such that the second zone will reach the target value 168 at substantially the same time as the second zone. In some implementations, the polishing rates of both the first portion and the second portion of the substrate are adjusted so that endpoint is reached at both portions simultaneously. Alternatively, the polishing rate of only the first portion or the second portion can be adjusted.

The sequence of output values provides an output signal. In some implementations, the output signal can be filtered prior to fitting the function. For example, in some situations, the output signal exhibits a regular periodic oscillation. Without being limited to any particular theory, this might be due to shifting orientation of the substrate from rotation to rotation of the platen. To compensate for this periodic oscillation, the following algorithm can be applied to the sequence of output values:

Processed Signal=sqrt[signal($t$)*signal($t$)+signal($t-\Delta t$)*signal($t-\Delta t$)]

where $\Delta t$ is one quarter of the period of oscillation. The period of oscillation can be determined, e.g., by performing a Fourier transform of the output signal and determining the peak frequency strength.

Initially, before conducting polishing, the current generator 62 can be tuned to the resonant frequency of the LC circuit, without any substrate present. This resonant frequency results in the maximum amplitude of the output signal.

Figure 11A:
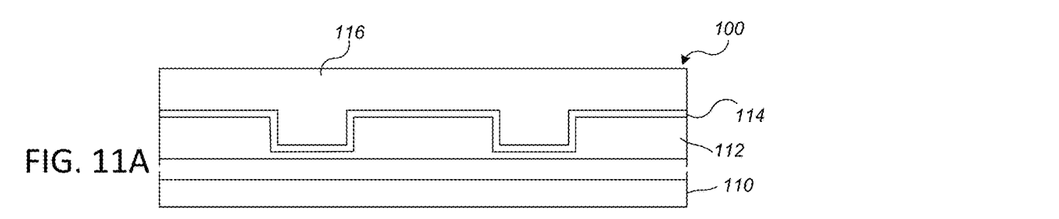
FIGS. 11A-11E schematically illustrate polishing of a substrate.

As shown in FIG. 11A, for a polishing operation, the substrate 100 is placed in contact with the polishing pad 30. The substrate 100 has the conductive layer 116 covering the underlying patterned dielectric layer 112. Since, prior to polishing, the bulk of the conductive layer 112 is initially relatively thick and continuous, it has a low resistivity. As a result, the magnetic field from an inductive monitoring system 40 can generate eddy currents in the conductive layer. The eddy currents cause the metal layer to function as an impedance source; this permits monitoring of the thickness of the substrate during bulk polishing of the conductive layer.

Figure 11B:
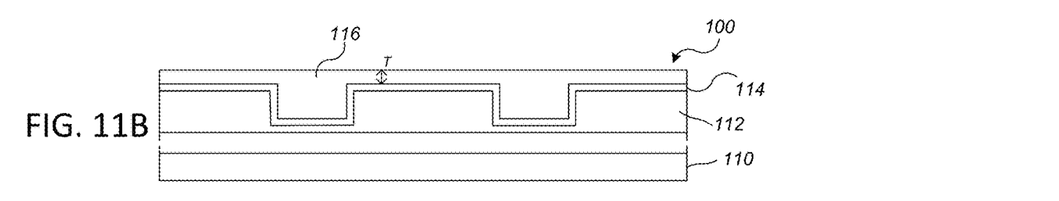

Referring to FIG. 11B, as the substrate 100 is polished the bulk portion of the conductive layer 116 is thinned. As the conductive layer 116 thins, its sheet resistivity increases, and the eddy currents in the metal layer become dampened. In some implementations, the substrate can be moved to a different platen when the inductive monitoring system or a different monitoring system determines that a predetermined thickness T of the conductive layer remains over the underlying layers.

Figure 11C:
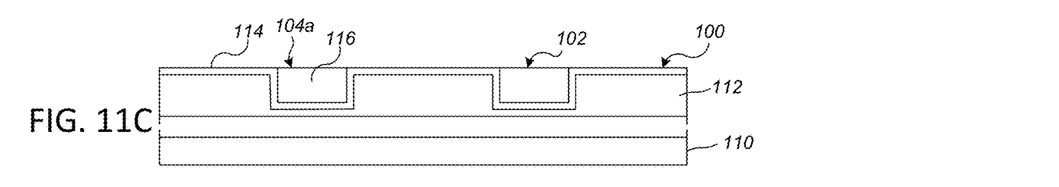

Referring to FIG. 11C, eventually the bulk portion of the conductive layer 116 is removed, exposing the barrier layer 114 and leaving conductive material 116 in the trenches between the patterned dielectric layer 112 to provide the interconnects 104a of device and the loop conductor 102. In some implementations, the substrate can be moved to a different platen when the inductive monitoring system or a different monitoring system, e.g., an optical monitoring system, determines that the barrier layer has been exposed.

Figure 11D:
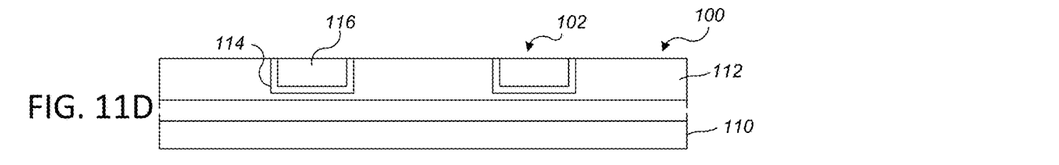

Referring to FIG. 11D, polishing continues to remove the barrier layer 114, exposing the top surface of the patterned dielectric layer 112. The depth of the conductive material 116 in the trenches is also reduced. In some implementations, the substrate can be moved to a different platen when the inductive monitoring system or a different monitoring system, e.g., an optical monitoring system, determines that the barrier layer has been exposed.

If the substrate is subject to both bulk polishing of the conductive layer and thinning of the dielectric layer at the same platen, then after exposure of either the barrier layer 114 or the top surface of the dielectric layer 112, the mode of the inductive monitoring system 40 is switched from a bulk thickness monitoring mode to trench depth monitoring mode. In general, in the trench depth monitoring mode, the peaks in the signal resulting from the conductive loops need to be detected and extracted from the overall signal to generate the sequence of values. In contrast, in the bulk thickness monitoring mode, no such peaks are expected or extracted, and the raw signal can be averaged to monitor bulk conductive layer thickness.

Figure 11E:
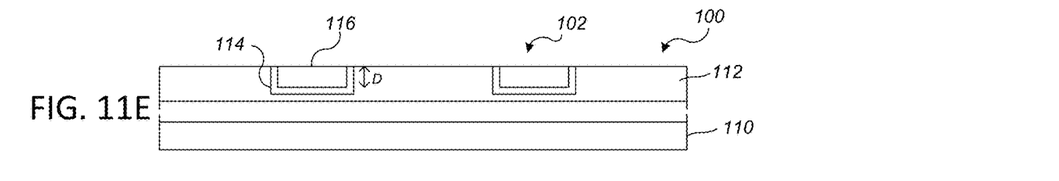

Referring to FIG. 11E, with the inductive monitoring system 40 in the trench depth monitoring mode, the substrate is polished. This thins both the dielectric layer 112 and reduces the depth of the conductive interconnects 116' in the trenches. As discussed above, the signal from the inductive monitoring system 40 can be used to detect a polishing endpoint and halt polishing when the trenches reach a target depth D and/or modify the polishing rate of different portions of the substrate to improve polishing uniformity.

In some implementations, rather than use the inductive monitoring system to monitor bulk polishing, the polishing station includes a separate eddy current monitoring system. In some implementations, the polishing station includes an optical monitoring system. The optical monitoring system can be used to detect exposure of the barrier or patterned dielectric layer. Detection of exposure of the barrier or patterned dielectric layer can be used to trigger monitoring with the inductive monitoring system, or to trigger the inductive monitoring system to switch from the bulk thickness monitoring mode to the trench depth monitoring mode.

In some implementations, after the polishing, the substrate is subjected to a buffing step.

The inductive monitoring systems can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad.

In addition, although the foregoing description focuses on monitoring during polishing, it would also be possible to apply these techniques to an in-line monitoring system. For example, a stationary sensor could be positioned in a section of the polishing apparatus before the polishing station, e.g., in the factory interface or in a module attached to the factor interface. The robot responsible for transporting the substrate could move the substrate past the sensor. Alternatively, the substrate could be positioned on a stand in the factory interface or in a module attached to the factor interface, and an actuator could move the sensor across the substrate while the substrate sits stationary. In either case, the series of measurements taken across the substrate can be equivalent to a single scan of the sensor of the in-situ monitoring system across the substrate, and can be processed as described above to generate a measurement of the depth of the trenches.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a non-transitory machine-readable storage medium or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

A number of embodiments of the invention have been described. Nevertheless, it will be understood that various modifications may be made without departing from the spirit and scope of the invention. Accordingly, other embodiments are within the scope of the following claims.

What is claimed is:

1. A method of chemical mechanical polishing a substrate, comprising:

in fabrication of an integrated circuit having a layer with a plurality of conductive interconnects, polishing a layer of a substrate to provide the layer of the integrated circuit, wherein the layer of the substrate includes conductive lines to provide the conductive interconnects, and wherein the layer of the substrate includes a closed conductive loop formed of a conductive material in a trench; and monitoring a depth of the conductive material in the trench using an inductive monitoring system and generating a signal, wherein monitoring includes generating a magnetic field from a core having a prong oriented substantially perpendicular to the layer of the substrate, wherein the magnetic field intermittently passes through the closed conductive loop, wherein a lateral dimension of the closed conductive loop is about 1-2 times a lateral dimension of the prong.

2. The method of claim 1, wherein conductive lines of the closed conductive loop have a width of about 0.5 to 10 microns.

3. The method of claim 1, wherein the closed conductive loop is positioned in a scribe line region between die regions of the substrate.

4. The method of claim 1, wherein the closed conductive loop is positioned within in a die region of the substrate.

5. The method of claim 1, wherein the conductive material is copper or cobalt.

6. The method of claim 1, wherein the closed conductive loop is not electrically connected to any of the conductive lines.

7. The method of claim 1, comprising extracting from the signal a sequence of values over time, the sequence of values representing the depth of the conductive material over time, and at least one of detecting a polishing endpoint by determining from the sequence of values that a depth of the conductive material has reached a target depth, or adjusting at least one pressure applied by a carrier head to the substrate during polishing of the layer based on the sequence of values such that different zones on the substrate have closer to the same endpoint time than without such an adjustment.

8. The method of claim 1, wherein monitoring the depth of the conductive material comprises generating a sequence of values over time, the sequence of values representing the depth of the conductive material over time.

9. The method of claim 8, comprising detecting a polishing endpoint by determining from the sequence of values that a depth of the conductive material has reached a target depth.

10. The method of claim 8, comprising adjusting at least one pressure applied by a carrier head to the substrate during polishing of the layer of the substrate based on the sequence of values such that different zones on the substrate have closer to the same endpoint time than without such an adjustment.

11. The method of claim 1, wherein the closed conductive loop is rectangular.

12. The method of claim 1, wherein the core comprises a plurality of prongs.

\* \* \* \* \*